United States Patent

Mackenthun

Patent Number: 6,034,997
Date of Patent: Mar. 7, 2000

[54] TRELLIS DECODING WITH MULTIPLE SYMBOL NONCOHERENT DETECTION AND INTERLEAVING TO COMBAT FREQUENCY OFFSET

[75] Inventor: Ken Mackenthun, Sunnyvale, Calif.

[73] Assignee: Stanford Telecommunications, Inc., Sunnyvale, Calif.

[21] Appl. No.: 08/985,302

[22] Filed: Dec. 4, 1997

Related U.S. Application Data

[60] Provisional application No. 60/056,134, Aug. 19, 1997.

[51] Int. Cl.[7] ................................................. H04L 23/02
[52] U.S. Cl. ......................... 375/265; 375/262; 375/259; 714/795
[58] Field of Search ................................. 375/265, 341, 375/295, 262, 259; 371/37.7, 38.1, 39.1, 44, 45, 46, 43.7, 47.1; 714/758, 761, 762, 787, 788, 789, 795, 798

[56] References Cited

U.S. PATENT DOCUMENTS

| | | | |
|---|---|---|---|
| 3,883,872 | 5/1975 | Fletcher et al. | 343/100 |
| 5,263,051 | 11/1993 | Eyuboglu | 371/43 |
| 5,535,220 | 7/1996 | Kanno et al. | 371/2.1 |
| 5,539,755 | 7/1996 | Baggen | 371/37.7 |
| 5,659,573 | 8/1997 | Bruckert et al. | 375/200 |
| 5,751,739 | 5/1998 | Seshadri et al. | 371/30 |
| 5,799,033 | 8/1998 | Baggen | 375/200 |

OTHER PUBLICATIONS

D. Makrakis and P.T. Mathipoulos, "Optimal Decoding in Fading Channels: A Combined Envelope, Multiple Differential and Coherent Detection Approach," *IEEE GLOBECOM*, 1989, pp. 1551–1557.

J.H. Lodge and M.L. Moher, "Maximum Likelihood Sequence Estimation of CPM Signals Transmitted Over Rayleigh Flat Fading Channels," *IEEE Transactions on Communications*, vol. 38, No. 6, Jun. 1990, pp. 787–794.

Y.M. Lam and P. Wittke, "Frequency–Hopped Spread Spectrum Transmission with Band–Efficient Modulations and Simplified Noncoherent Sequence Estimation," *IEEE Transactions on Communications*, vol. 38, No. 12, Dec. 1990, pp. 2184–2196.

T.R. Giallorenzi and S.G. Wilson, "Noncoherent Sequence Demodulation for Trellis Coded M–DPSK," *MILCOM* 91, Washington D.C., Nov. 1991.

D. Divsalar, M.K. Simon, and M. Shahshahani, "The Performance of Trellis Coded MDPSK with Multiple Symbol Detection," *IEEE Transactions on Communications*, Sep. 1990, vol. 38, No. 9, pp. 1391–1403.

D. Makrakis, A. Yongacoglu, and K. Feher, "A Sequential Decoder for Differential Detection of Trellis Coded PSK Signals," *IEEE ICC*, 1988, pp. 1433–1438.

F. Edbauer, "Performance of interleaved trellis–coded differential 8–PSK modulation over fading channels," *IEEE Transactions on Selected Areas in Communications*, vol. 7 No. 9, Dec. 1989, pp. 1340–1346.

K. Mackenthun, "Trellis coding with multiple–symbol differential detection," 1993 43rd IEEE Vehicular Technology Conference, May 18–20, 1993, Secaucus, NJ, pp. 376–379.

(List continued on next page.)

*Primary Examiner*—Chi H. Pham
*Assistant Examiner*—Emmanuel Bayard
*Attorney, Agent, or Firm*—Townsend and Townsend and Crew LLP; Henry K. Woodward

[57] ABSTRACT

A solution to the problem of frequency offset in a digital communication system. On the transmitter side, interleaving is applied to a stream of symbols to which an error correcting code has been applied. The interleaving is such that symbols of the stream are divided into two groups, e.g, alternating symbols are assigned to different groups. The result of interleaving is a burst where symbols of a first one of the group are transmitted in ascending order and symbols of a second one of the group are transmitted in descending order. In one embodiment, the second group comes first in the burst, then one or more synchronization symbols followed by the first group.

13 Claims, 7 Drawing Sheets

OTHER PUBLICATIONS

A. N. D'Andrea, U. Mengali, and G.M. Vitetta, "Approximate ML decoding of coded PSK with no explicit carrier phase reference," *IEEE Transactions on Communications*, vol. 42, No. 2/3/4, Feb./Mar./Apr. 1994, pp. 1033–1039.

D. Divsalar and M.K. Simon, "Maximum–likelihood differential detection of uncoded and trellis coded amplitude phase modulation over AWGN and fading channels–metrics and performance," *IEEE Transactions on Communications*, vol. 42, No. 1, Jan. 1994, pp. 76–89.

K. Mackenthun, "Convergence behavior and differential trellis code construction for decoders using multiple symbol detection," *32nd Annual Allerton Conference on Communication, Control, and Computing*, Monticello, IL, Sep. 28–30, 1994, pp. 493–502.

T. Andersson and N. A. B. Svensson, "Noncoherent Detection of Convolutionally Encoded Continuous Phase Modulation," *IEEE Journal on Selected Areas in Communications*, vol. 7, No. 9, Dec. 1989, pp. 1402–1414.

W. Harrold and N. Kingsbury, "A Partially Coherent Detector for Continuous Phase Modulation," *IEEE Journal on Selected Areas In Communications*, vol. 7, No. 9, Dec. 1989, pp. 1415–1426.

R. Haeb and H. Meyr, "A Systematic Approach to Carrier Recovery and Detection of Digitally Phase Modulated Signals on Fading Channels," *IEEE Transactions on Communications*, vol. 37, No. 7, Jul. 1989, pp. 748–754.

P. Y. Kam and H. C. Ho, "Viterbi Detection and Simultaneous Suboptimal Maximum Likelihood Carrier Phase Estimation," *IEEE Transactions on Communications*, vol. 36, No. 12, Dec. 1988, p. 1327–1330.

D. Raphaeli, "Noncoherent Coded Modulation," *IEEE Transactions on Communications*, vol. 44, No. 2, Feb. 1996, pp. 172–183.

D. Raphaeli, "Decoding Algorithms for Noncoherent Trellis Coded Modulation," *IEEE Transactions on Communications*, vol. 44, No. 3, Mar. 1996, pp. 312–323.

D. Divsalar and M. K. Simon, "The use of interleaving for reducing noisy reference loss in trellis–coded modulation systems," *IEEE Transactions on Communications*, vol. 38, No. 8, Aug. 1990, pp. 1190–1198.

TRELLIS DECODING WITH MULTIPLE SYMBOL NONCOHERENT DETECTION AND INTERLEAVING TO COMBAT FREQUENCY OFFSET

STATEMENT OF RELATED APPLICATIONS

This application claims the benefit of U.S, Provisional Application No. 60/056,134, filed Aug. 19, 1997, the disclosure of which is incorporated by reference.

BACKGROUND OF THE INVENTION

The present invention relates generally to digital communication systems and more particularly to a technique for providing enhanced performance. The discussion that follows assumes an understanding of digital communication principles as known to those of skill in that art. A good general reference in the digital communication field is John G. Proakis, Digital Communications, (McGraw-Hill 1995), herein incorporated by reference.

Conventional Viterbi Algorithm

The Viterbi algorithm accepts as input a sequence of received symbols and determines the maximum likelihood sequence of transmitted symbols. The Viterbi algorithm is applied to decode convolutional coding or trellis coding applied at the transmitter end or to remove the effects of a partial response channel. The algorithm is perhaps best understood by reference to a so-called trellis diagram. A trellis diagram is a time-indexed state diagram. At each trellis stage, n, there are two or more states. Transitions between states at a trellis stage, n, and states at a trellis stage n+1 denote transmitted symbols. A path through the trellis consists of a number of successive transitions and denotes a sequence of symbols. The number of states at each stage and the correspondence between transitions and symbols are particular to the relevant trellis code, convolutional code, or partial response channel characteristics. The Viterbi algorithm uses received symbol information to identify a particular path through the trellis and thus determine the maximum likelihood sequence of transmitted symbols.

Computation of the maximum likelihood sequence proceeds on a stage-by-stage basis. Possible paths are eliminated once it becomes clear they cannot be the maximum likelihood path. Given received symbol information, the likelihood of a particular branch being taken is evaluated according to a measure known as the branch metric. For each state, the Viterbi algorithm computes the branch metrics for the surviving paths leading to that state. The branch metric will typically consist of the previously accumulated branch metric for the path plus the branch metric for the transition taken to the new state. Based on the accumulated branch metrics for all the paths leading to the state, the Viterbi algorithm selects a best path to the state and eliminates the other states. Only one path survives to each stage, permitting identification of the maximum likelihood transmitted symbol sequence.

Figure 2:
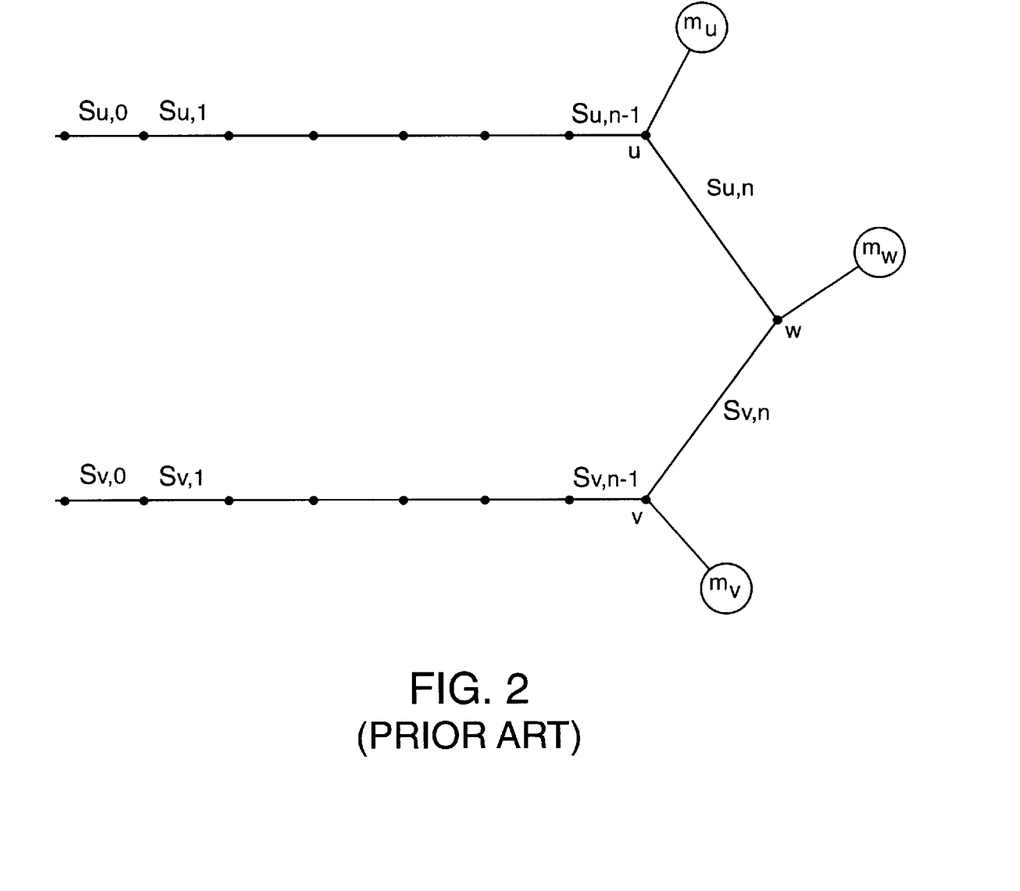
FIG. 2 depicts the prior art operation of a Viterbi decoding algorithm assuming channel phase is known.

FIG. 2 depicts the prior art operation of a Viterbi decoding algorithm assuming channel phase is known. Consider an AWGN channel model, $$r_n = e^{j\Theta} A s_n + w_n, n = \ldots 0, 1, 2, \ldots,\quad (1)$$

where $\Theta$ is channel phase; below we consider two cases where channel phase is known and where it is completely unknown. The transmitted symbol $s_n$ is an MPSK symbol, where $s_k = e^{j\emptyset_k}$, and $\emptyset_k$ is a uniformly distributed random phase taking values in $\{0, 2\pi/M, \ldots 2\pi(M-1)/M\}$. The received sample is $r_n$, and $w_n$ is an independent sample of zero mean white complex Gaussian noise of variance $o^2$.

The mathematics of a conventional Viterbi decoding algorithm for a convolutional code, assuming channel phase $\Theta$ is known will now be described. To simplify the description, assume the convolutional code has two branches into and out of each state. FIG. 2 depicts a state diagram wherein two states, u and v, at stage n−1, which both have a single branch into state w at stage n. Associated with state u is the previously determined winning path into state u, denoted by $s_{u,0}, s_{u,1}, \ldots s_{u,n-1}$, and a path metric $m_u$. Associated with state v is the previously determined winning path into state v, denoted by $s_{v,0}, s_{v,1}, \ldots s_{v,n-1}$, and a path metric $m_v$. Let $s_{u,n}$ be the symbol on the branch from state u to state w, and let $s_{v,n}$ be the symbol on the branch from state v to state w. Let $s_0, s_1, \ldots s_{n-1}, s_n$ be the first n actual transmitted symbols, and let $r_0, r1, \ldots r_{n-1}, r_n$ be the corresponding received samples. The following discussion explains how to update state w at stage n, by finding the winning branch into state w, the winning path into state w, and the winning path metric for state w. The conventional Viterbi algorithm proceeds in four steps:

(1) Form two branch metrics $$Re\ [r_n s^*_{u,n}(s^{j\Theta})^*],\quad (2)$$

and $$Re\ [r_n s^*_{v,n}(s^{j\Theta})^*].\quad (3)$$

(2) Use branch metric (2) to form a candidate path metric for the top path, $$m_u + Re\ [r_n s^*_{u,n}(e^{j\Theta})^*],\quad (4)$$

and use branch metric (3) to form a candidate path metric for the bottom path, $$m_v + Re\ [r_n s^*_{v,n}(e^{j\Theta})^*].\quad (5)$$

(3) Compare (4) and (5) and select a winner, say (4).
(4) Update state w at stage n. The winning path into state w at stage n is $s_{w,0}, s_{w,1}, \ldots s_{w,n-1}, s_{w,n}$ where $$(s_{w,0}, s_{w,1}, \ldots s_{w,n-1}, s_{w,n}) = (s_{u,0}, s_{u,1}, \ldots s_{u,n-1}, s_{u,n}).$$

The winning path metric is $$m_w = m_u + Re\ [r_n s^*_{v,n}(e^{j\Theta})^*].$$

Non-coherent Viterbi Decoding Algorithm Operation

Figure 3:
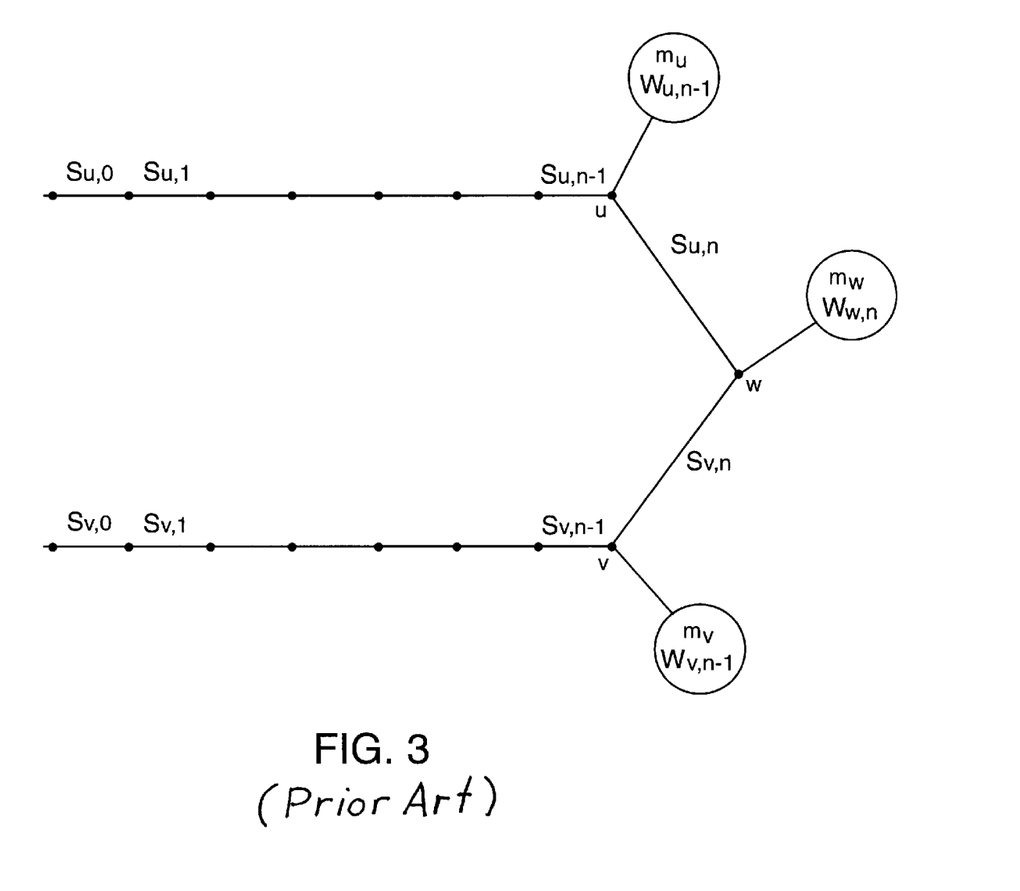
FIG. 3 depicts the prior art operation of a Viterbi decoding algorithm using multiple symbol noncoherent detection.

FIG. 3 depicts the prior art operation of a Viterbi decoding algorithm using multiple symbol noncoherent detection. Non-coherent Viterbi decoding is described in [9] A. N. D'Andrea, U. Mengali, and G. M. Vitetta, "Approximate ML decoding of coded PSK with no explicit carrier phase reference," *IEEE Transactions on Communications*, Vol. 42, no. 2/3/4, February/March/April 1994, pp. 1033–1039, incorporated herein by reference. This approach can be used without an explicit phase reference, and so assume that $\Theta$ in (1) is uniformly distributed on $(-\pi, \pi)$. FIG. 3 is the same as FIG. 2 except that each state has a path history variable associated with it; thus states u and v at stage n−1 have the path history variables $W_{u,n-1}$ and $W_{v,n-1}$, associated with them, respectively, where $W_{u,n-1}$ and $W_{v,n-1}$ are defined by $$W_{u,n-1} = \sum_{k=0}^{n-1} a^{n-1-k} r_k s^*_{u,k}$$

and

-continued $$W_{v,n-1} = \sum_{k=0}^{n-1} \alpha^{n-1-k} r_k s_{v,k}^*,$$

and α is a real number in the range $0 \leq \alpha \leq 1$. For a particular state x, $x \in \{u,v\}$, the path history variable is a function of the winning path into state x, $s_{x,0}, s_{x,1}, \ldots s_{x,n-1}$, and the channel sample history $r_0, r_1, \ldots r_{n-1}, r_n$; the path history variable for a particular path acts as a remodulated phase reference for that path and takes the place of the coherent phase reference term $(e^{j\Theta})^*$ in steps (1)–(4) above.

The discussion will now turn to how to find the winning branch into state w at stage n, the winning path into state w, the winning path metric for state w, and the path history variable for state w at stage n, $W_{w,n}$. The modified Viterbi algorithm proceeds in four steps:

(1a) Form two branch metrics $$Re[r_n s^*_{u,n} W^*_{u,n-1}], \qquad (6)$$

and $$Re[r_n s^*_{v,n} W^*_{v,n-1}]. \qquad (7)$$

(2a) Use branch metric (6) to form a candidate path metric for the top path, $$m_u + Re[r_n s^*_{u,n} W^*_{v,n-1}], \qquad (8)$$

and use branch metric (7) to form a candidate path metric for the bottom path, $$m_v + Re[r_n s^*_{v,n} W^*_{v,n-1}]. \qquad (9)$$

(3a) Compare (8) and (9) and select a winner, say (8).
(4a) Update state w at stage n. The winning path into state w at stage n is $s_{w,0}, s_{w,1}, \ldots s_{w,n-1}, s_{w,n}$ where $$(s_{w,0}, s_{w,1}, \ldots s_{w,n-1}, s_{w,n}) = (s_{u,0}, s_{u,1}, \ldots s_{u,n-1}, s_{u,n}).$$

The winning path metric is $$m_w = m_u + Re[r_n s^*_{u,n} W^* u, n-1].$$

The winning path history variable is $$W_{w,n} = r_n s^*_{u,n} + \alpha W_{u,n-1}.$$

Note that steps (1a)–(4a) are very similar to steps (1)–(4), with the path history variable taking the place of the coherent phase reference term $(e^{j\Theta})^*$.

Steps (1a)–(4a), illustrate one particular way of implementing trellis decoding with multiple symbol noncoherent detection. There are several other ways of implementing trellis decoding with multiple symbol noncoherent detection described in the literature which differ in how the branch metrics in (1a) are formed. However all approaches are fundamentally the same in that each branch metric in (1a) is formed using received samples and previous symbols along the winning path into that branch.

Problems of Digital Communication

The goal of digital communication is the error-free transmission of digital data over a transmission medium. To achieve this goal, there are various problems that the designer of digital communication equipment must overcome. One such problem is establishing phase and frequency synchronization between the receiver and the transmitter. Typically, analog tracking loops have been used to establish phase and frequency synchronization. The performance of these loops is affected phase slips and other problems. The non-coherent Viterbi decoding scheme described above represents a partial solution to the problem of phase synchronization in that the decoder does not need to know the phase shift introduced between the transmitter and receiver. However, this scheme is unsatisfactory in dealing with frequency offset as may be introduced by e.g., transmitter and receiver oscillators or Doppler shift arising in mobile communications.

SUMMARY OF THE INVENTION

The present invention offers a solution to the problem of frequency offset in a digital communication system. On the transmitter side, interleaving is applied to a stream of coded symbols. The result of the interleaving process is an interleaved burst. Within the burst, symbols earliest in the stream are found closest to the center. Even-numbered symbols from the stream are assigned in consecutive order proceeding from the burst center to one edge of the burst. Odd-numbered symbols from the stream are assigned in consecutive order proceeding from the burst center to the other edge of the burst. In one embodiment, the burst center includes one or more synchronization symbols that separate the odd-numbered and even-numbered symbols.

On the receiver side, non-coherent Viterbi detection is applied to the received burst. When evaluating branch metrics for the non-coherent Viterbi technique, phase references are maintained independently for the even-numbered symbols and the odd-numbered symbols. For even-numbered symbols, a positive frequency offset results in counterclockwise rotation of symbol signal points as would be depicted in a two-dimensional constellation. For odd-numbered symbols, which come in reverse order in the burst, a positive frequency offset results in clockwise rotation of symbol signal points. (It will be understood that the even-numbered and odd-numbered symbols could be switched between the burst halves.) Thus, as successive branch metrics are formed, the branch metrics are first biased in one direction and then in the other direction due to frequency offset. This effect reduces the bias caused by frequency offset.

A first aspect of the present invention provides a method for communicating digital data while correcting for frequency offset. The method includes steps of: interleaving a stream of symbols to which an error correcting code has been applied to develop a burst of symbols wherein the burst includes a first section wherein earlier symbols of a first group of symbols of the stream are transmitted earlier than later symbols of the first group and a second section wherein later symbols of a second group of symbols of the stream are transmitted earlier than earlier symbols of the second group, transmitting the burst of symbols over a channel, receiving the burst of symbols from the channel, and noncoherently detecting the burst of symbols according to a modified Viterbi technique wherein phase references are maintained independently for the first group and for the second group, whereby frequency offset introduced prior to the detecting step is ameliorated.

A second aspect of the present invention provides a digital communication system including a transmitter and a receiver. The transmitter interleaves a stream of symbols to which an error correcting code has been applied to develop a burst of symbols. The burst includes a first section wherein earlier symbols of a first group of symbols of the stream are transmitted earlier than later symbols of the first group and a second section wherein later symbols of a second group of symbols of the stream are transmitted earlier than earlier symbols of the second group. The transmitter transmits the burst over a channel. The receiver noncoherently detects the burst of symbols according to a modified Viterbi technique wherein phase references are maintained independently for the first group and for the second group, whereby frequency offset effects are ameliorated.

A third aspect of the present invention provides a transmitter apparatus including an interleaver that interleaves a stream of symbols to which an error correcting code has been applied to develop a burst of symbols. The burst includes a first section wherein earlier symbols of a first group of symbols of the stream are transmitted earlier than later symbols of the first group and a second section wherein later symbols of a second group of symbols of the stream are transmitted earlier than earlier symbols of the second group.

A fourth aspect of the present invention provides a receiver apparatus for use in a digital communication system. In the digital communication system, a stream of symbols to which an error correcting code has been applied has been interleaved to develop a burst of symbols. The burst includes a first section wherein earlier symbols of a first group of symbols of the stream are transmitted earlier than later symbols of the first group and a second section wherein later symbols of a second group of symbols of the stream are transmitted earlier than earlier symbols of the second group. The receiver apparatus includes a non-coherent detector operating in accordance with a modified Viterbi technique wherein phase references are maintained independently for the first group and for the second group, whereby frequency offset effects are ameliorated.

A further understanding of the nature and advantages of the inventions herein may be realized by reference to the remaining portions of the specification and the attached drawings.

DESCRIPTION OF SPECIFIC EMBODIMENTS

Figure 1A:
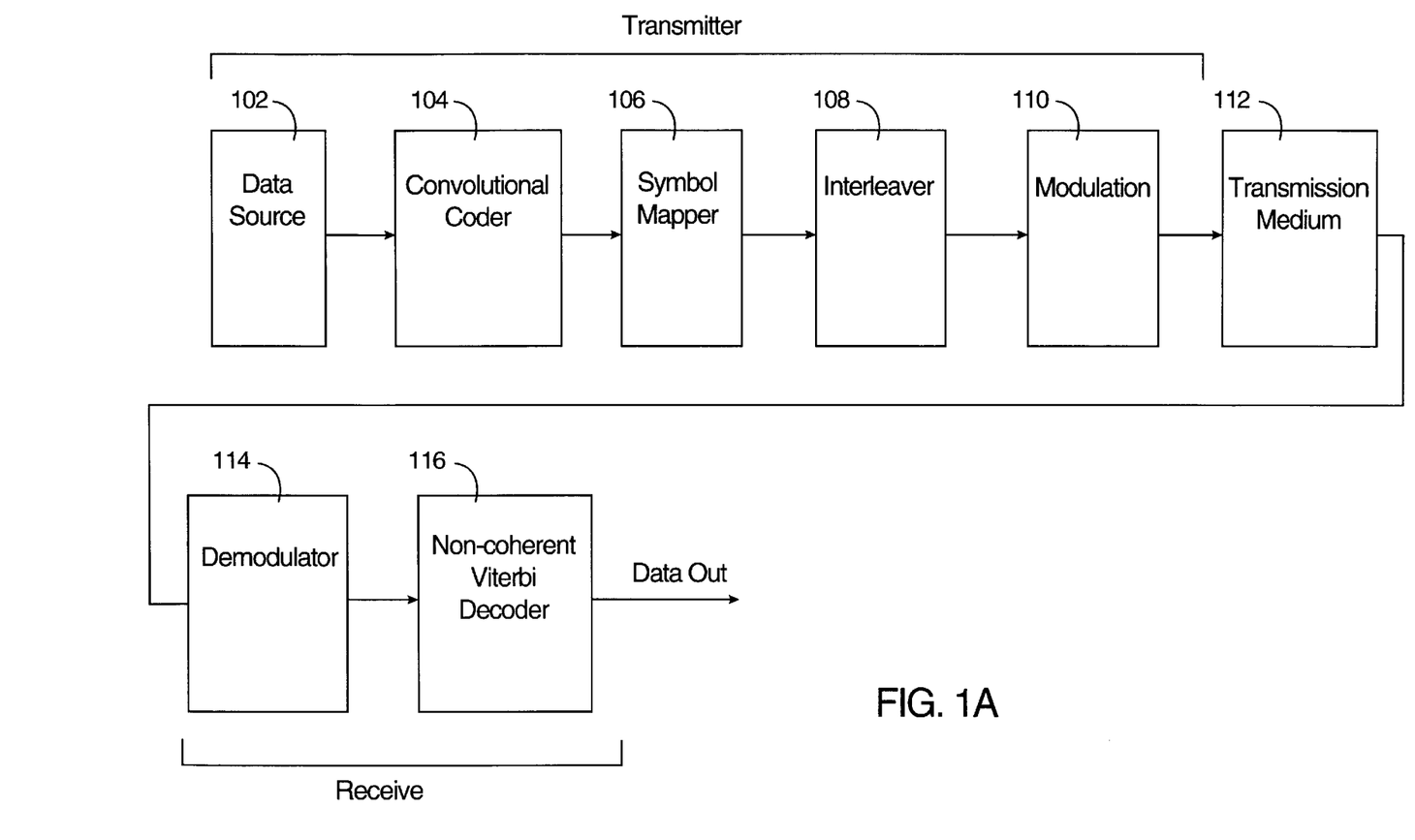
FIG. 1A depicts a top-level diagram of a digital communication system in accordance with one embodiment of the present invention.

FIG. 1A depicts a top-level diagram of a digital communication system 100 in accordance with one embodiment of the present invention. Digital data originates from a data source 102. A convolutional coder 104 applies an error correcting code to the data. Depending on the modulation type, groups of 1 or more bits of coded data are mapped to symbols by a symbol mapper 106. An interleaver 108 changes the order of the symbols according to the present invention. The operation of interleaver 108 will be explained in greater detail with reference to FIG. 4. A modulation block 110 is shown to indicate the functions of modulation, upconversion, amplification, and transmission. Ultimately, a modulated signal is transmitted over a transmission medium 112.

On the receiver side, a demodulator 114 recovers the symbols from the signal as received by a transmission 112. Demodulator 114 incorporates functions of tuning, preamplification, downconversion, and demodulation. Demodulator 114 outputs recovered symbols to a noncoherent Viterbi decoder 116. Modulation block 110, transmission medium 112, and demodulator 114 may together be considered to be a "channel" between interleaver 108 and non-coherent Viterbi decoder 116. Non-coherent Viterbi decoder 116 is specially modified in accordance with the invention as will be explained with reference to FIGS. 5–6.

Figure 1B:
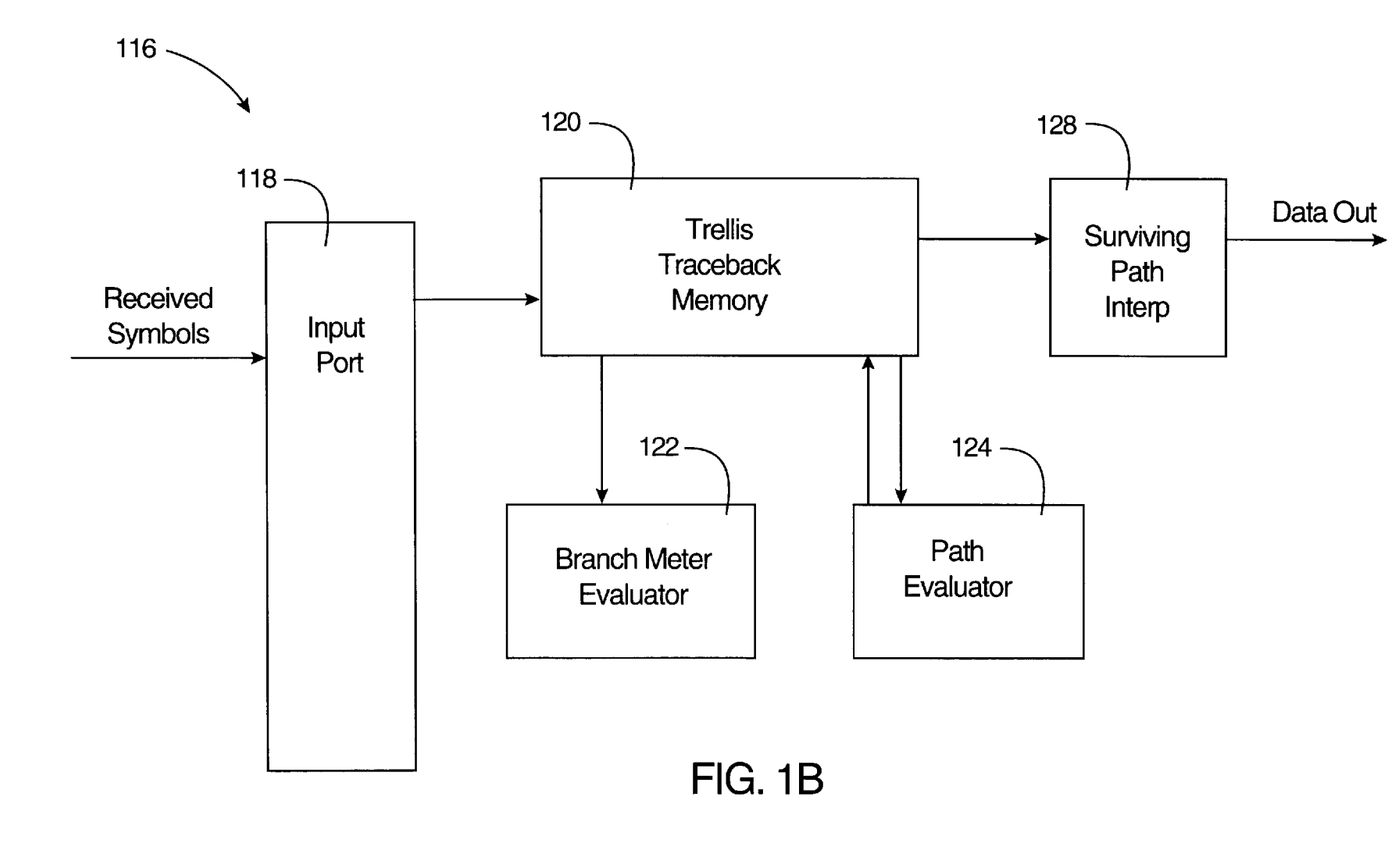
FIG. 1B is a functional representation of the operation of a non-coherent Viterbi decoder in accordance with one embodiment of the present invention.

FIG. 1B is a functional representation of the operation of non-coherent Viterbi decoder 116. The received symbol stream is accepted by an input port 118. During Viterbi processing, a path evaluator 124 identifies at each stage, a surviving path to each state. Information about the surviving paths is stored in a trellis traceback memory 120. The evaluation and selection of surviving paths is a function of multiple branch metrics evaluated for transitions between states at successive stages. These evaluations are performed by a branch metric evaluator 122. A traceback operation identifies a winning path which then results in an estimate of the transmittal symbols.

Figure 4:
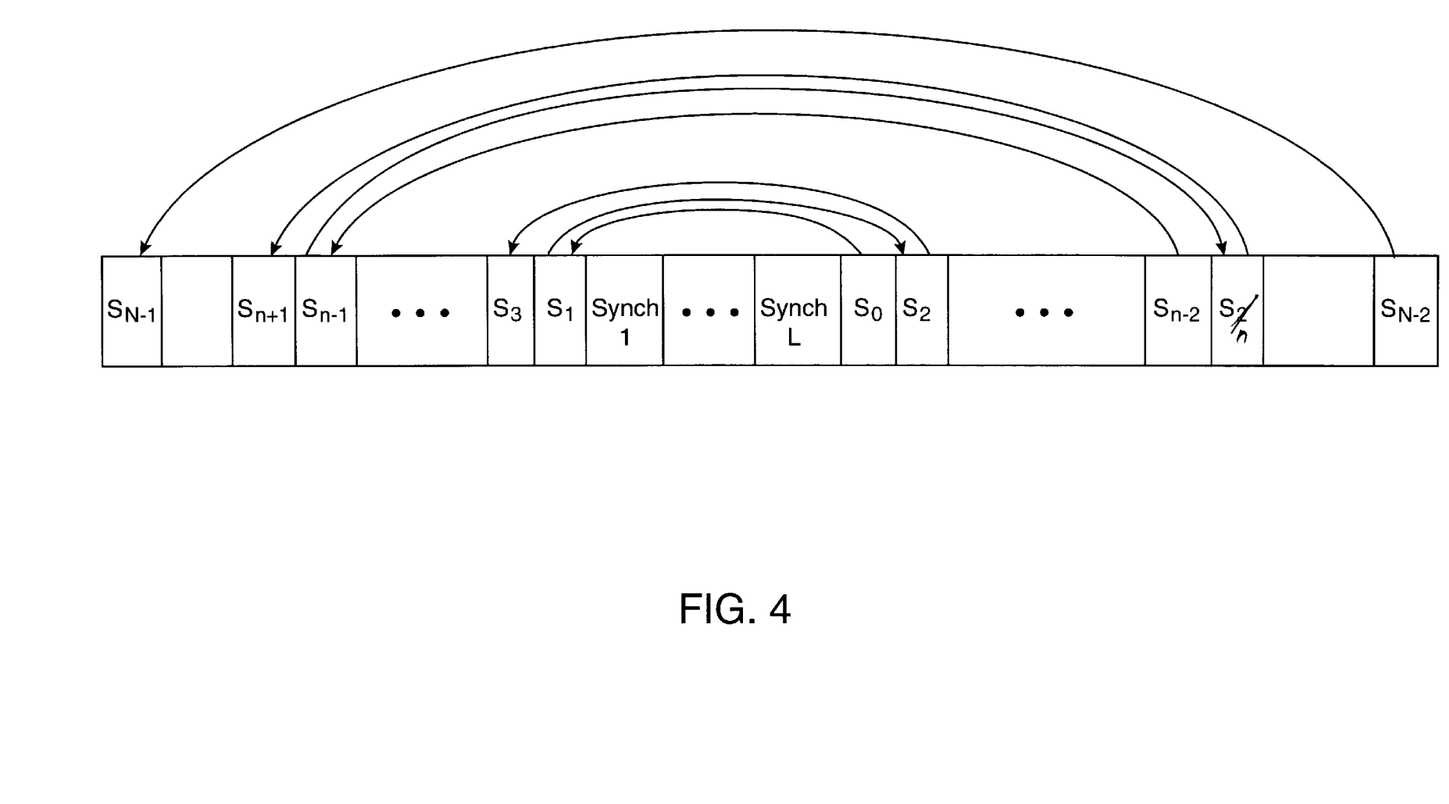
FIG. 4 depicts the transmission of N encoded MPSK symbols in a burst in a channel with unknown phase according to one embodiment of the present invention.

FIG. 4 depicts the transmission of N encoded MPSK symbols in a burst in a channel with unknown phase according to one embodiment of the present invention. The input to interleaver 108 is a stream of symbols as output by symbol mapper 106. Interleaver 108 develops a burst of symbols from symbols $s_0$ through $s_{N-1}$ of the stream. The center of the burst is L known synch symbols, $L \geq 1$. The encoded symbols of the stream are interleaved in a definite pattern so that one symbol falls on one side of the synch symbols, the next symbol falls on the other side, and so on. Thus, a first group of symbols of the stream follow the synchronization symbols and a second group of symbols of the stream precede the synchronization symbols. Symbols in the first group appear in the same order as in the stream. Symbols in the second group appear in reverse order as compared to their order in the stream. Symbols from the first group and symbols from the second group alternate in the stream.

Non-coherent Viterbi decoder 110 takes advantage of the special interleaved burst structure shown in FIG. 4 to alleviate frequency offset effects. As will now be explained, the branch metric is evaluated independently for two successive symbols, $s_n$, and $s_{n+1}$. The branch metric for symbol $s_n$, on the right side of the synch burst, is formed solely of symbols on the right side of the synch pattern: $s_0, s_2, \ldots s_{n-2}$; and the branch metric for symbol $s_{n+1}$ on the left side of the synch burst, is formed solely of symbols on the left side of the synch pattern: $s_1, s_3, \ldots s_{n-1}$. Assume that symbols $s_0, s_2, \ldots s_{n-2}, s_n$ are unmodulated and symbol signal points are observed as symbol processing proceeds from $s_0$ to $s_2$, to $s_4$, etc., to $s_{n-2}$, and finally to $s_n$. Assume for example that frequency offset in the receiver is positive; then the successive symbol signal points rotate in a clockwise direction. Now, looking to the left side of the synch burst, at symbols $s_1, s_3, \ldots s_{n-1}, s_{n+1}$, and assuming these symbols are also unmodulated, then for the same positive frequency offset, the symbol signal points travel in a counterclockwise direction. Then upon formation of successive branch metrics, first from one side and then from the other, the branch metrics are first biased in one direction and then the other from frequency offset. This means that path metrics in Viterbi decoding are less biased from frequency offset.

In particular, if one were to use a 4-dimensional code where the first of the two symbols assigned to a branch was from one side of the synch burst and the other symbol was from the other side of the synch burst, then the path metrics formed by the Viterbi decoder would be unbiased for frequency offset. Whether one uses a conventional 2D code or a 4D code, the net effect of forming the branch metrics in this way is that trellis path metrics are less influenced by frequency offset, and therefore the selection of the winning path is less biased by frequency offset. The effect is similar to using an interleaver to randomize phase error to improve Viterbi decoder performance in the presence of phase offset.

Figure 5:
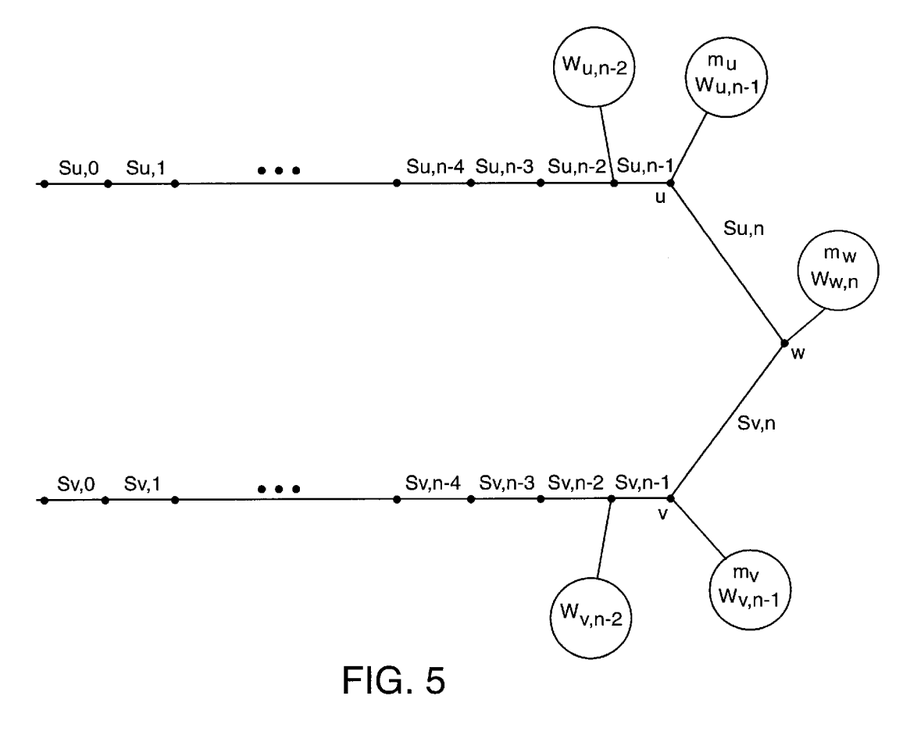
FIG. 5 depicts the operation of a non-coherent Viterbi decoder operating on a group of symbols received in the burst of FIG. 4 according to one embodiment of the present invention.

How the branch metrics are formed for symbol $s_n$ and symbol $s_{n+1}$ will now be explained. FIG. 5 shows the formation of the branch metric for symbol $s_n$. In contrast to FIG. 3, there are now two path history variables associated with each path, $W_{u,n-2}$ and $W_{u,n-1}$ for the top path and $W_{v,n-2}$ and $W_{v,n-1}$ for the bottom path. These are defined by $$W_{u,n-2} = \sum_{k=0}^{(n-2)/2} \alpha^{n-2-2k} r_{2k} s^*_{u,2k},$$

(note that n−2 is even), $$W_{u,n-1} = \sum_{k=0}^{(n-2)/2} \alpha^{n-2-2k} r_{2k+1} s^*_{u,2k+1},$$

(note that n−1 is odd), and $$W_{v,n-2} = \sum_{k=0}^{(n-2)/2} \alpha^{n-2-2k} r_{2k} s^*_{v,2k},$$

$$W_{v,n-1} = \sum_{k=0}^{(n-2)/2} \alpha^{n-2-2k} r_{2k+1} s^*_{v,2k+1}.$$

Figure 6:
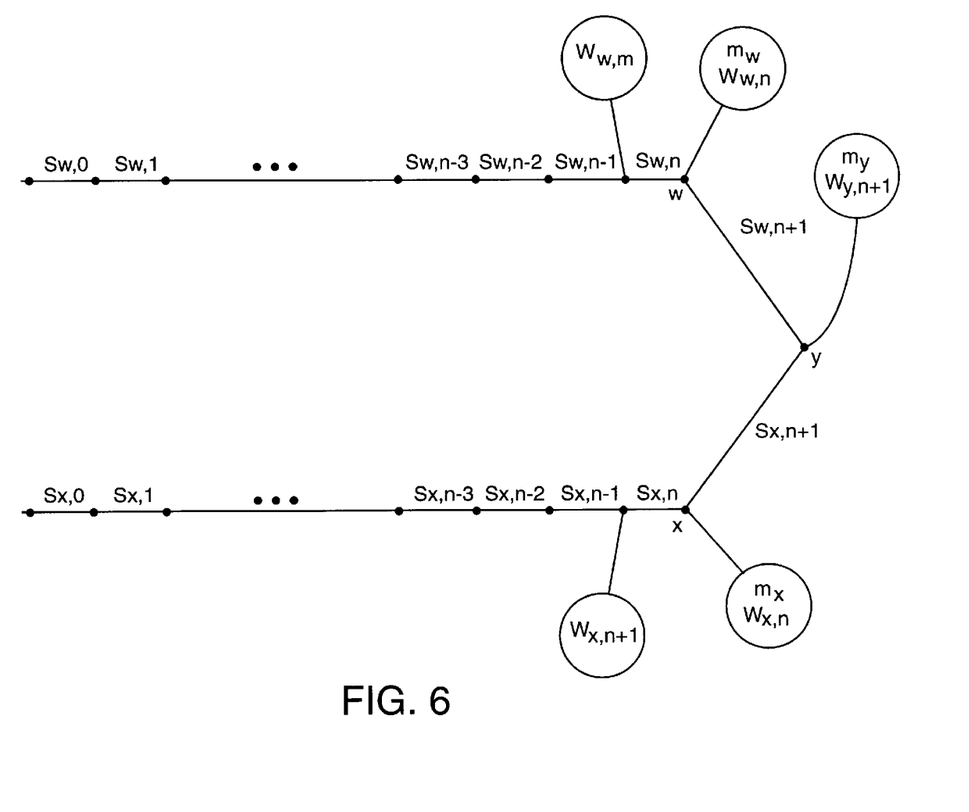
FIG. 6 depicts the operation of a non-coherent Viterbi decoder operating on another group of symbols received in the burst of FIG. 4 according to one embodiment of the present invention.

The present invention provides special techniques for finding the winning branch into state w at stage n, the winning path into state w, the winning path metric for state w, and the path history variables for state w at stage n, $W_{w,n}$. FIG. 6 shows how these results are achieved independently for stage n+1. For stage n, the modified Viterbi algorithm proceeds in four steps:

(1b) Form two branch metrics $$Re[r_n s^*_{u,n} W^*_{u,n-2}],\quad (10)$$

and $$Re[r_n s^*_{v,n} W^*_{v,n-2}]. \quad (11)$$

(2b) Use branch metric (10) to form a candidate path metric for the top path, $$m_u + Re[r_n s^*_{u,n} W^*_{u,n-2}], \quad (12)$$

and use branch metric (11) to form a candidate path metric for the bottom path, $$m_v + Re[r_n s^*_{v,n} W^*_{v,n-2}], \quad (13)$$

(3b) Compare (12) and (13) and select a winner, say (12).

(4b) Update state w at stage n. The winning path into state w at stage n is $s_{w,0}, s_{w,1}, \ldots s_{w,n-1}, s_{w,n}$ where $$(s_{w,0}, s_{w,1}, \ldots s_{w,n-1}, s_{w,n}) = (s_{u,0}, s_{u,1}, \ldots s_{u,n-1}, s_{u,n}).$$

The winning path metric is $$m_w = m_u + Re[r_n s^*_{u,n} W^*_{u,n-2}].$$

The winning path history variable is $$W_{w,n} = r_n s^*_{u,n} + \alpha W_{u,n-2}.$$

Set $W_{w,n-1} = W_{u,n-1}$. It can thus be seen that the calculations of path history variable and branch metric for stage n depend on these parameters for prior symbols on the same side of the synchronization symbols within a burst.

FIG. 6 depicts how to find the winning branch, winning path, winning path metric, and path history variables for state considered n+1, where the previously considered state at stage n, w, is connected to state y. As previously, the modified Viterbi algorithm proceeds in four steps:

(5b) Form two branch metrics $$Re[r_{n+1} s^*_{w,n+1} W^*_{w,n-1}], \quad (14)$$

and $$Re[r_{n+1} s^*_{x,n+1} W^*_{x,n-1}], \quad (15)$$

where $W_{x,n-1}$ is defined analogously to $W_{w,n-1}$.

(6b) Use branch metric (14) to form a candidate path metric for the top path, $$m_w + Re[r_{n+1} s^*_{w,n+1} W^*_{w,n-1}], \quad (16)$$

and use branch metric (15) to form a candidate path metric for the bottom path, $$m_x + Re[r_{n+1} s^*_{x,n+1} W^*_{x,n-1}]. \quad (17)$$

(7b) Compare (16) and (17) and select a winner, say (16).

(8b) Update state y at stage n+1. The winning path into state y at stage n+1 is $s_{y,0}, s_{y,1}, \ldots s_{y,n}, s_{y,n+1}$ where $$(s_{y,0}, s_{y,1}, \ldots s_{y,n}, s_{y,n+1}) = (s_{w,0}, s_{w,1}, \ldots s_{w,n}, s_{w,n+1}).$$

The winning path metric is $$m_y = m_w + Re[r_{n+1} s^*_{w,n+1} W^*_{w,n-1}].$$

The winning path history variable is $$W_{y,n+1} = r_{n+1} s^*_{w,n+1} + \alpha W_{w,n-1}.$$

Set $W_{y,n} = W_{w,n}$. Again, it can be seen that the calculations for path history variable and path metric for stage n+1 depend on the past values associated with previous symbols on the same side of the synchronization symbols within the burst.

Steps (1b)–(8b), illustrate one particular way of implementing trellis decoding with multiple symbol noncoherent detection to alleviate frequency offset which is based on the particular implementation of multiple symbol noncoherent detection discussed in (1a)–(4a). However, as discussed in connection with (1a)–(4a), one can easily modify the particular way of doing multiple symbol noncoherent detection and obtain a superficially different implementation, which however in fundamental principle is the same as that illustrated.

For example, although discussed for MPSK modulation, the same technique of diversity combining can be used with other modulations. Although discussed for the AWGN channel, the same technique can be used for other channel impairments, e.g., fading channels.

In the foregoing specification, the invention has been described with reference to specific exemplary embodiments thereof. It will, however, be evident that various modifications and changes may be made thereunto without departing from the broader spirit and scope of the invention as set forth in the appended claims and their full scope of equivalents.

What is claimed is:

1. In a digital communication system using Viterbi decoding, a method for communicating digital data while correcting for frequency offset comprising the steps of:

interleaving a stream of symbols to which an error correcting code has been applied to develop a burst of symbols having a first section wherein earlier symbols of a first group of symbols of said stream are transmitted earlier than later symbols of said first group and a second section wherein later symbols of a second group of symbols of said stream are transmitted earlier than earlier symbols of said second group whereby symbols earliest in the stream are closest to the center of the burst, even-numbered symbols being assigned in consecutive order proceeding from the burst center to one edge of the burst and odd-numbered symbols are assigned in consecutive order proceeding from the burst center to the other edge of the burst, transmitting said burst of symbols over a channel;

receiving said burst of symbols from said channel; and noncoherently detecting said burst of symbols according to a modified Viterbi technique wherein phase references are maintained independently for said first group and for said second group, whereby frequency offset introduced prior to said detecting step is ameliorated.

2. The method of claim 1 wherein symbols of said first group and symbols of said second group alternate in said stream.

3. The method of claim 1 wherein symbols of said first group follow one or more synchronization symbols in said burst and symbols of said second group precede said one or more synchronization symbols in said burst.

4. A digital communication system comprising a transmitter and a receiver employing Viterbi decoding, said transmitter interleaving a stream of symbols to which an error correcting code has been applied to develop a burst of symbols having a first section wherein earlier symbols of a first group of symbols of said stream are transmitted earlier than later symbols of said first group and a second section wherein later symbols of a second group of symbols of said stream are transmitted earlier than earlier symbols of said second group, said transmitter transmitting said burst over a channel whereby symbols earliest in the stream are closest to the center of the burst, even-numbered symbols being assigned in consecutive order proceeding from the burst center to one edge of the burst and odd-numbered symbols are assigned in consecutive order proceeding from the burst center to the other edge of the burst; and said receiver noncoherently detecting said burst of symbols according to a modified Viterbi technique wherein phase references are maintained independently for said first group and for said second group, whereby frequency offset effects are ameliorated.

5. The method of claim 4 wherein symbols of said first group and symbols of said second group alternate in said stream.

6. The method of claim 4 wherein symbols of said first group follow one or more synchronization symbols in said burst and symbols of said second group precede said one or more synchronization symbols in said burst.

7. For use in digital communication system, a transmitter apparatus for trellis encoded data comprising:

an interleaver that interleaves a stream of symbols to which an error correcting code has been applied to develop a burst of symbols having a first second whereby earlier symbols of a first group of symbols of said stream are transmitted earlier than later symbols of said first group and a second section wherein later symbols of a second group of symbols of said stream are transmitted earlier than earlier symbols of said second group, whereby symbols earliest in the stream are closest to the center of the burst, even-numbered symbols being assigned in consecutive order proceeding from the burst center to one edge of the burst and odd-numbered symbols are assigned in consecutive order proceeding from the burst center to the other edge of the burst.

8. The transmitter of claim 7 wherein symbols of said first group and symbols of said second group alternate in said stream.

9. The transmitter of claim 7 wherein symbols of said first group follow one or more synchronization symbols in said burst and symbols of said second group precede said one or more synchronization symbols.

10. The transmitter of claim 7 further comprising a convolutional coder that provides said stream of symbols.

11. For use in a digital communication system wherein a stream of symbols to which an error correcting code has been applied has been interleaved to develop a burst of symbols having a first second wherein earlier symbols of a first group of symbols of said stream are transmitted earlier than later symbols of said first group and a second section wherein later symbols of a second group of symbols of said stream are transmitted earlier than later symbols of said second group, whereby symbols earliest in the stream are closest to the center of the burst, even-numbered symbols being assigned in consecutive order proceeding from the burst center to one edge of the burst and odd-numbered symbols are assigned in consecutive order proceeding from the burst center to the other edge of the burst, a receiver apparatus comprising:

a non-coherent detector operating in accordance with a modified Viterbi algorithm wherein phase references are maintained independently for said first group and for said second group, whereby frequency offset effects are ameliorated.

12. The receiver of claim 11 wherein symbols of said first group and symbols of said second group alternate in said stream.

13. The receiver of claim 11 wherein symbols of said first group follow one or more synchronization symbols in said burst and symbols of said second group precede said one or more synchronization symbols.

* * * * *